United States Patent [19]

Benzoni

[11] Patent Number: 5,416,668

[45] Date of Patent: May 16, 1995

[54] SHIELDED MEMBER

[75] Inventor: Albert M. Benzoni, Lower Macungie Township, Lehigh County, Pa.

[73] Assignee: AT&T Corp., Murray Hill, N.J.

[21] Appl. No.: 149,422

[22] Filed: Nov. 9, 1993

[51] Int. Cl.⁶ .............................................. H05K 9/00
[52] U.S. Cl. ..................... 361/816; 361/818; 174/35 R
[58] Field of Search ....................... 361/816, 817, 818; 174/51, 35 R, 35 MS; 257/659, 660; 331/67; 334/85; 343/841; 358/255

[56] References Cited

U.S. PATENT DOCUMENTS

| | | | |
|---|---|---|---|
| 3,903,328 | 9/1975 | Burdette, Jr. et al. | 427/122 |
| 4,404,125 | 9/1983 | Abolins et al. | 252/511 |
| 4,435,031 | 3/1984 | Black et al. | |
| 4,474,685 | 10/1984 | Annis | 252/503 |
| 4,494,095 | 1/1985 | Noji et al. | 174/35 R |
| 4,754,101 | 7/1988 | Stickney et al. | 174/35 R |
| 4,948,923 | 8/1990 | Suzuki | 174/35 R |

Primary Examiner—Bot Ledynh
Attorney, Agent, or Firm—David L. Smith

[57] ABSTRACT

A shielded member includes a nonconductive housing for mounting on a substrate. The housing includes a cavity and has a base to be received against the substrate. The housing includes at least one integral mounting post extending beyond the base for reception in respective aperture in the substrate. A conductive coating extends over at least a portion of the housing and at least a portion of the integral mounting post. The conductive coating provides shielding for the cavity with currents induced in the conductive coating on the housing conductible to a trace on the substrate by way of the conductive coating on the integral mounting post.

32 Claims, 2 Drawing Sheets

SHIELDED MEMBER

TECHNICAL FIELD

This invention relates to a shielded housing, and in particular to a shielded housing providing an electrically conductive path to a substrate on which the housing is mounted.

BACKGROUND OF THE INVENTION

Prior art metal housings for optical transceivers have been cast, molded, formed, or machined from a variety of alloys, such as an aluminum alloy. Some metal mounting posts were press inserted or threaded into holes in the housings. Other metal housings had mounting posts that were integrally machined or cast oversized and machined in a secondary operation. It has been found during wave soldering of electrical leads and the mounting posts to traces on a substrate, that the metal housing acts as a large heat sink with respect to the mounting posts. This has caused cold solder joints to form at some mounting posts. The cold solder joints decrease the reliability of a circuit path from the housing to an electrically conductive trace on the substrate on which the housing is mounted, and reduce the retention force of the solder joints that secure the housing to the substrate. Concomitantly, a failed solder joint will reduce the shielding effectiveness of the housing by including a high impedance in the path between the conductive housing and an electrically conductive trace on the substrate.

Prior art plastic housings for optical transceivers have included insert molded, ultrasonically bonded, or threaded, screw inserted metal mounting posts. The ultrasonically bonded mounting posts were typically plated, along with the housing, after insertion. The threaded screw inserted mounting posts were typically mounted into the housing after both the housing and the mounting posts were individually plated. Inserting the mounting post subsequent to both the housing and mounting posts being individually plated has caused the plating to crack.

The above problems, coupled with tolerance requirements on the positioning of the mounting posts, requires that each housing be inspected after manufacture. This increases the cost of manufacturing housings for optical transceivers. A need remains in the art for a cost effective technique for providing shielding to a housing while simultaneously providing a reliable low impedance path to conduct electrostatic energy or energy induced by electromagnetic radiation to an electrically conductive trace.

SUMMARY OF THE INVENTION

In accordance with one aspect of the present invention, a shielded member includes a nonconductive housing for mounting on a substrate having a conductive trace thereon. The housing includes a cavity and has a base adapted to be positioned against the substrate. The housing includes one or more integral mounting posts extending beyond the base for reception in respective apertures in the substrate. A conductive coating extends over at least a portion of the housing and at least a portion of one or more integral mounting post. The conductive coating provides shielding for devices the cavity, with currents induced in the conductive coating on the housing being conductible to an electrically conductible on the substrate by way of the conductive coating on the integral mounting post.

DETAILED DESCRIPTION

Figure 1:
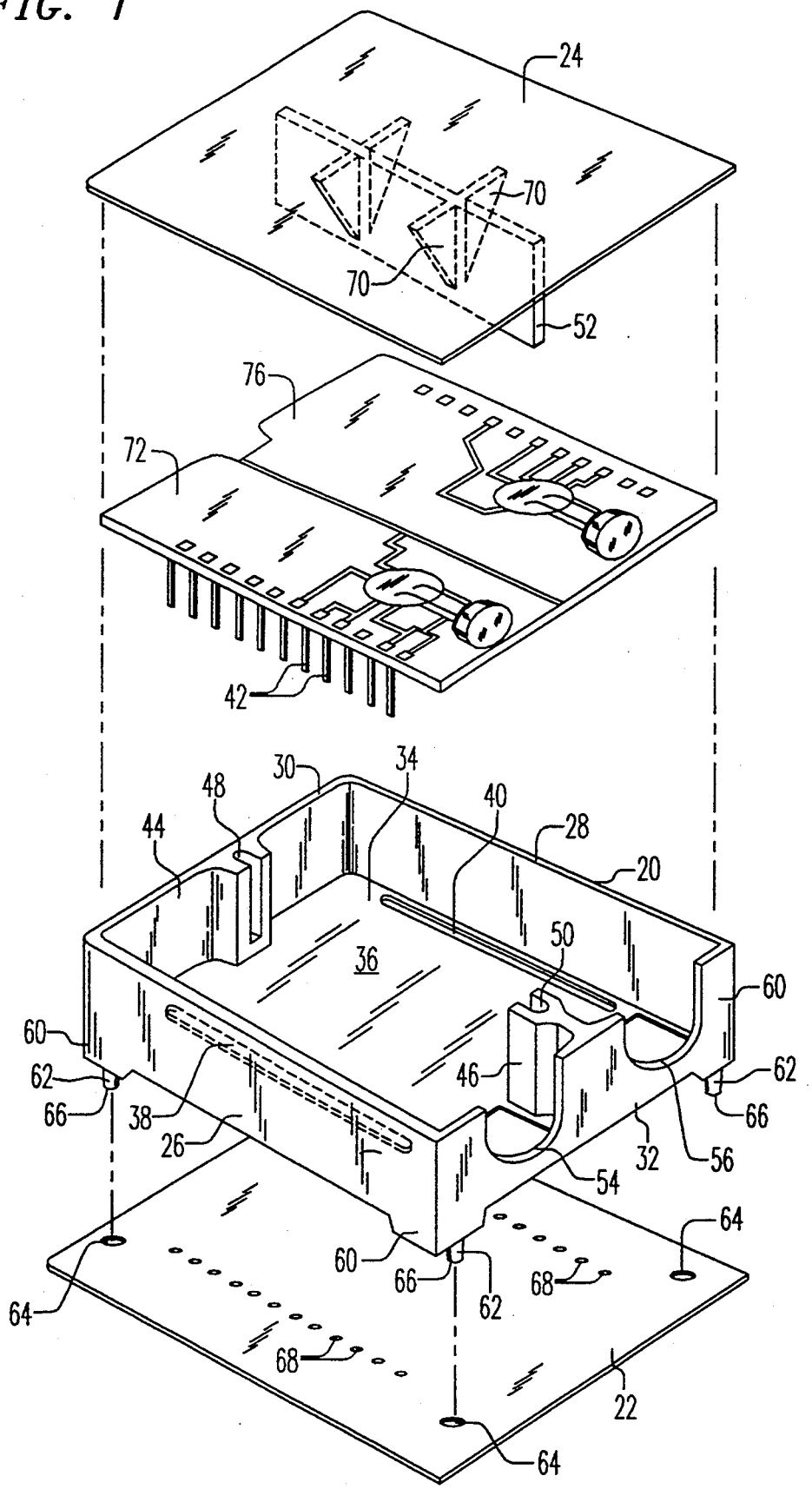
FIG. 1 is an exploded perspective view of a housing for an optical transceiver, in accordance with an illustrative embodiment of the present invention, positioned over a substrate on which the transceiver is adapted to be mounted.

FIG. 1 is an exploded perspective view of a portion of an optical transceiver including an illustrative embodiment of the invention showing of a housing 20 positioned over a substrate 22, such as a substrate, on which it is adapted to be mounted. Lid 24 is positioned above the housing. Housing 20 and lid 24 are preferably molded of a nonconductive material. Nonconductive means the material has an electrically insulating matrix. The electrically insulating matrix that may or may not contain electrically conductive particles. The level of measurable conductivity of the material, as measured through volume resistivity, is proportional to the density and interconnection of the electrically conductive particles in the electrically insulating matrix. When the material contains electrically conductive particles, the shielding effectiveness may not be sufficient to effectively shield electrically sensitive circuits or to block emissions from highly radiating circuits. Preferably housing 20 and lid 24 are molded of a platable engineering grade plastic. The plastic is preferably a high temperature plastic such as polyether sulfone, polyetherimide, or a liquid crystal polymer.

Figure 2:
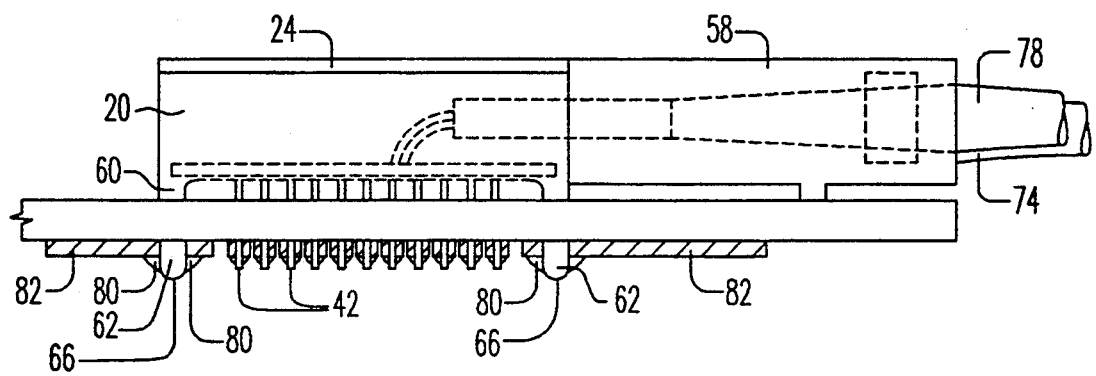
FIG. 2 is a side view of the transceiver of FIG. 1, having a receptacle secured thereto and a pair of optical cables coupled to the transceiver, with the leads and mounting posts soldered to traces on a substrate.

Housing 20 has side walls 26 and 28 and end walls 30 and 32 that extend upwardly from a bottom wall 34 to define a cavity 36 within housing 20. In bottom wall 34, extending along side walls 26 and 28, are clearance slots 38 and 40 through which leads 42 extend. Ribs 44 and 46 are positioned centrally between side walls 26 and 28. They extend inwardly into cavity 36 and toward each other from end walls 30 and 32. Each rib has a channel extending away from bottom wall 34. These channels, 48 and 50, are each adapted to receive an end of the receiver-transmitter lid shield 52. End wall 32 also includes two U-joints 54 and 56 for joining receptacle 58 (see FIG. 2). Extending downward from the lower surface of bottom wall 34 at corners of housing 20 are standoffs 60. The lower surface of standoffs 60 define a plane and engage the upper surface of a substrate 22 on which housing 20 is mounted. The standoffs provide a gap between the lower surface of bottom wall 34 and the top surface of the substrate. This gap allows the surface of the substrate to be washed subsequent to soldering the housing onto the substrate.

Extending downwardly from each stand off is a mounting post 62. Mounting posts 62 are integrally molded with housing 20. In the illustrative embodiment, mounting posts 62 are cylindrical in cross section and smaller in diameter than apertures 64 in substrate 22 in which the mounting posts are adapted to be received. Typically mounting posts 62 extend beyond the standoff a greater distance than leads 42 and have a tapered or radiused distal end 66 to facilitate insertion into apertures 64. They also typically extend beyond standoffs 60 a greater distance than leads 42. This arrangement causes leads 42 to be aligned with plated through holes 68 when mounting posts 62 are aligned with and are inserted into apertures 64.

Lid 24 is planar with lid shield 52 extending from an inner surface. Gusset plates 70 extend from the under surface of lid 24 to shield 52 to support the lid shield and maintain lid 24 flat. Lid shield 52 is sized to have ends received in channels 48 and 50. When lid 24 is positioned on the housing with ends of the lid shield received in the channels, lid shield 24 and ribs 44 and 46 divide cavity 36 into two portions. A transmitter 72 is housed in the first portion of cavity 36 and is coupled through U-joint 54 to optical interface 74 (see FIG. 2). A receiver 76 is housed in the second portion of cavity 36 and is coupled to optical interface 78 (see FIG. 2) through U-joint 56. Transmitter 72 and receiver 76 are well known in the art. Although the transmitter 72 and receiver 76 are shown mounted on a single substrate, they could be mounted on a separate substrates. When the transmitter and receiver are mounted on separate substrates, lid shield 52 may extend between the substrates.

To provide shielding, surfaces of housing 20 and lid 24 are uniformly plated with an electrically conductive material, such as copper, in an electroless plating process, as is known in the art. During the plating process, housing 20 and lid 24 may be held at locations that minimize the loss of effective shielding, such as on surfaces of channels 48 and 50 of housing 20 and on gusset plates 70 of lid 24. The conductive layer provides a low resistance electrically conductive coating that effectively blocks, or shields, electrostatic and electromagnetic energy from passing through the housing, lid, or lid shield. A layer of another material, such as nickel, can be deposited over the conductive layer to prevent oxidation and scratching.

Lid shield 52 prevents digital switching noise in the form of electromagnetic radiation generated in the first portion of cavity 36 by transmitter 72 from passing into the second portion of cavity 36. It is undesirable to have electromagnetic radiation induced in the conductors and leads of components, such as integrated circuits, in the more sensitive receiver 76. The receiver is more sensitive to electromagnetic radiation than the transmitter because it operates at very low current levels and with very large amplification factors.

Lid 24 is secured to housing 20 by a conductive medium, such as conductive epoxy or solder, to provide continuity in a low resistance electrical path from the conductive coating on the lid to the conductive coating on the housing. Lid 24, when received on housing 20, effectively encloses cavity 36 and the optical-electric transducers therein within shielded members.

While electroless plating provides a coating over all surfaces of the housing and lid, masking portions of the surfaces with a stop-off paint prior to plating would result in selective plating. All surfaces of the housing and lid do not have to be plated to provide effective shielding. For example, it would not be necessary to plate both the inside and outside surfaces of the housing, or to plate both the inner and outer surfaces of the lid. Gaps in the shielding do not diminish shielding effectiveness as long as the gaps are smaller than one-half of the shortest wavelength of any frequency of interest, as is known in the art.

With the housing mounted on substrate 22, any currents induced in the conductive coating on the housing or lid can be conducted through the conductive coating on the integral mounting posts to an electrically conductive trace 82 on the substrate. Posts 62 may be soldered, such as at 80 (see FIG. 2), to the conductive trace to provide a law impedance path from the conductive coating on the integral mounting posts to the conductive trace on the circuit board. A conductive trace may be provided either on the upper or lower surface of substrate 22.

Figure 3:
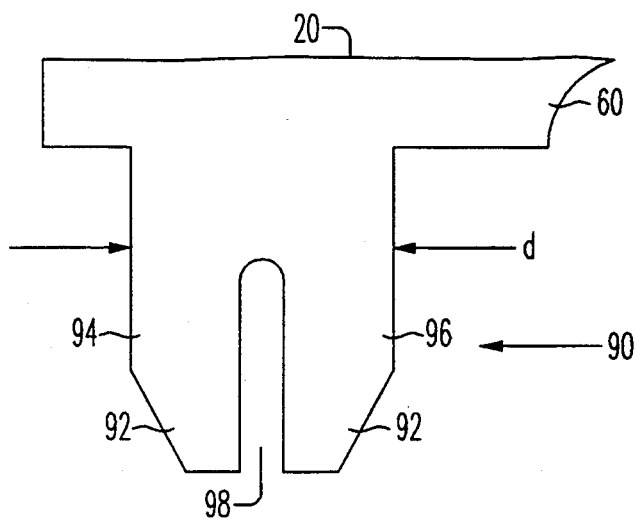
FIG. 3 as an enlarged side view of an alternate embodiment mounting post providing a friction fit.
Figure 4:
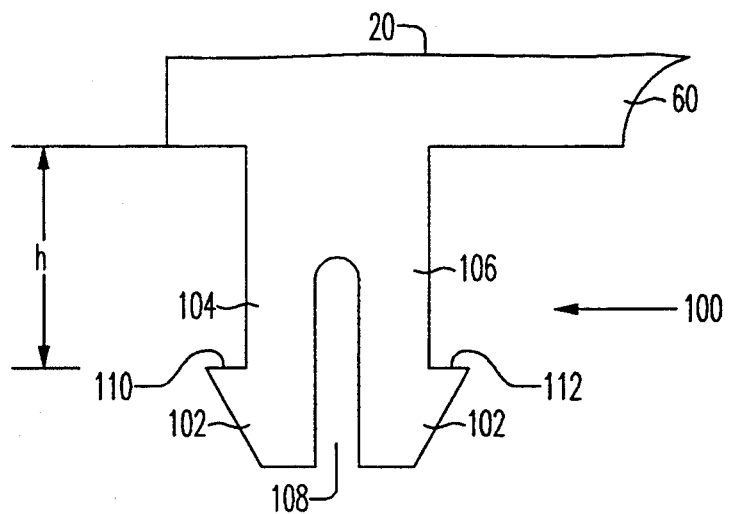
FIG. 4 is an enlarged side view of yet another alternate embodiment mounting post providing a bayonet latch.

While mounting posts 62 in the illustrative embodiment of the invention are sized to pass into apertures 64 without an interference fit, the invention is not limited thereto. By way of example and not limitation, alternative embodiment mounting posts are shown in FIGS. 3 and 4. In FIG. 3, alternative embodiment mounting post 90 has a dimension, d, that provides an interference fit with side walls of apertures 64. Tapered ends 92 of individual members 94 and 96 cooperate with apertures 64 to facilitate entry into the apertures. Slot 98 permits the individual members 94 and 96 to flex toward each other during insertion.

FIG. 4 shows a bayonet type mounting post 100. Tapered ends 102 of individual members 104 and 106 cooperate with apertures 64 and substrate 22 to facilitate entry of mounting post 100 into apertures 64. Slot 108 permits individual members to flex toward each other during insertion. Surfaces 110 and 112 are spaced a distance, h, below the bottom of standoffs 60 that corresponds to the thickness of substrate 22 on which housing 20 will be mounted. Surfaces 110 and 112 latch under substrate 22 to secure housing 20 to substrate 22.

Other designs of mounting posts exist with which the invention can be utilized. Furthermore, in place of the plated copper, a conductive paint can be applied to housing 20, including integral mounting posts 62, or lid 24 to achieve similar results.

For aesthetic purposes, housing 20 and lid 24 may be masked and selectively painted after being plated. When the paint is not electrically conductive and unplatable, the paint acts as a solder mask in the region of mounting posts 62. This controls the distance along mounting posts 62 that solder is wicked during a soldering process. To facilitate soldering, mounting posts 62 may be tinned or coated with a layer of solder. Since PES has a heat deflection temperature where parts molded therefrom start to deform at 205° C., which is higher than the minimum 180° C. melt temperature of 63–37 tin-lead solder, housings molded with integral mounting posts can withstand the wave solder process. Furthermore, since the housing is nonconductive, it does not act as a heat sink thereby obviating the cold solder joint problem encountered in the prior art.

While electroless plating has been described, the housing and lid could be electroplated after an initial flash layer of electroless plating. Although electroplating is faster, the thickness of plating varies compared to electroless plating due to the plating rate being voltage gradient dependent and the field being geometry dependent.

I claim:

1. A shielded member, comprising:
   a nonconductive housing for mounting on a substrate having an electrically conductive trace, the housing defining a cavity and having a base to be received against the substrate, the housing having at least one integral mounting post extending beyond the base for reception in an aperture in the substrate, the housing having an electrically conductive coating extending over at least a portion thereof and at least a portion of the at least one integral mounting post, whereby the conductive coating shields the cavity, with energy induced in the conductive coating on the housing being conductible to the electrically conductive trace on the substrate when the housing is mounted thereon by way of the conductive coating on the integral mounting post.

2. A shielded member as recited in claim 1, wherein the nonconductive housing is molded of a material containing electrically conductive particles.

3. A shielded member as recited in claim 1, wherein the nonconductive housing and integral mounting post are molded.

4. A shielded member as recited in claim 3, wherein the housing and integral mounting post are molded of a material taken from the group consisting of polyether sulfone, polyetherimide, and liquid crystal polymer.

5. A shielded member as recited in claim 1, wherein the electrically conductive coating is a metal applied by electroless plating.

6. A shielded member as recited in claim 5, wherein the metal is copper.

7. A shielded member as recited in claim 1, wherein the electrically conductive coating is a conductive paint.

8. A shielded member as recited in claim 1, further comprising a lid, the lid having an electrically conductive coating, the conductive coating on the lid electrically commoned with the conductive coating extending over at least a portion of the housing.

9. A shielded member as recited in claim 8, wherein the lid further comprises a partition member extending into the cavity, the partition member having a conductive coating, the partion member dividing the cavity into a first portion and a second portion, whereby emissions generated in one of the portions are prevented from entering the other portion.

10. A shielded member as recited in claim 1, further comprising a coating that is not electrically conductive extending over at least a portion of the conductive coating, the nonconductive coating capable of providing a mask to limit the flow of solder when the shielded member is mounted on and soldered to the substrate.

11. A shielded member as recited in claim 1, wherein the at least one integral mounting post extends from the base of the housing.

12. A shielded member as recited in claim 1, further comprising a solder coating over the conductive coating on the mounting post.

13. A shielded transceiver, comprising:
a nonconductive housing for mounting on a substrate having an electrically conductive trace, the housing defining a cavity, the housing having a base to be received against the substrate, the housing having at least one integral mounting post extending beyond the base for reception in an aperture in the substrate, the housing having an electrically conductive coating extending over at least a portion thereof and at least a portion of the at least one integral mounting post; and a receiver and transmitter received in the cavity, whereby the conductive coating provides shielding of the receiver and transmitter from electrostatic and electromagnetic energy with energy induced in the conductive coating on the housing conductible to the electrically conductive trace on the substrate when the shielded transceiver is mounted thereon by way of the conductive coating on the integral mounting post.

14. A shielded transceiver as recited in claim 13, wherein the nonconductive housing and integral mounting post are molded.

15. A shielded transceiver as recited in claim 14, wherein the nonconductive housing and integral mounting post are molded of a material taken from the group consisting of polyether sulfone, polyetherimide, and liquid crystal polymer.

16. A shielded transceiver as recited in claim 13, wherein the electrically conductive coating is a metal applied by electroless plating.

17. A shielded transceiver as recited in claim 13, wherein the electrically conductive coating is a conductive paint.

18. A shielded transceiver as recited in claim 13, further comprising a lid, the lid having a conductive coating, the conductive coating on the lid electrically commoned with the conductive coating extending over at least a portion of the housing.

19. A shielded transceiver as recited in claim 18, wherein the lid further comprises a partition member extending into the cavity, the partition member having a conductive coating, the partition member dividing the cavity into a first portion receiving the transmitter and a second portion receiving the receiver, whereby digital switching noise in the form of electromagnetic interference generated by the transmitter is prevented from radiating into the second portion of the cavity.

20. A shielded transceiver as recited in claim 13, further comprising a nonconductive coating extending over at least a portion of the conductive coating, the nonconductive coating capable of providing a mask to limit the flow of solder when the shielded transducer is soldered to the substrate.

21. A shielded transceiver as recited in claim 13, wherein the at least one integral mounting post extends from the base of the housing.

22. A shielded transceiver as recited in claim 13, further comprising a solder coating over the conductive coating on the mounting post.

23. A shielded housing for an electro-optic circuit, comprising:
a nonconductive housing for mounting on a substrate having an electrically conductive trace, the housing having a cavity, the housing having a base to be received against the substrate and an integral mounting post extending beyond the base for reception in an aperture in the substrate, the housing having an electrically conductive coating extending over at least a portion of the housing and at least a portion of the integral mounting post; and
an electro-optic circuit received in the cavity, whereby the conductive coating shields the electro-optic circuit from electrostatic or electromagnetic energy with any energy induced in the conductive coating on the housing conductible to an electrically conductive trace on the substrate by way of the conductive coating on the integral mounting post.

24. A shielded housing for an electro-optic circuit as recited in claim 23, wherein the nonconductive housing and integral mounting post are molded.

25. A shielded housing for an electro-optic circuit as recited in claim 23, wherein the housing and integral mounting post are molded of a material taken from the group consisting of polyether sulfone, polyetherimide, and liquid crystal polymer.

26. A shielded housing for an electro-optic circuit as recited in claim 23, wherein the electrically conductive coating is a metal applied by electroless plating.

27. A shielded housing for an electro-optic circuit as recited in claim 23, wherein the electrically conductive coating is a conductive paint.

28. A shielded housing for an electro-optic circuit as recited in claim 23, further comprising a lid, the lid having a conductive coating, the conductive coating on the lid electrically commoned with the conductive coating extending over at least a portion of the housing.

29. A shielded housing for an electro-optic circuit as recited in claim 28, wherein the lid further comprises a partition member extending into the cavity, the partition member having a conductive coating, the partition member dividing the cavity into a first portion for receiving a first portion of the electro-optic circuit and a second portion for receiving a second portion of the electro-optic circuit, whereby digital switching noise generated by the the first portion of the electro-optic circuit is prevented from radiating into the second portion of the cavity.

30. A shielded housing for an electro-optic circuit as recited in claim 23, further comprising a coating that is not electrically conductive extending over at least a portion of the conductive coating, the nonconductive coating capable of providing a mask to limit the flow of solder when the shielded housing is soldered to the substrate.

31. A shielded housing for an electro-optic circuit as recited in claim 23, wherein the integral mounting post extends from the base of the housing.

32. A shielded housing for an electro-optic circuit as recited in claim 23, further comprising a solder coating over the conductive coating on the mounting post.

* * * * *